United States Patent
Takano et al.

(10) Patent No.: US 6,834,004 B2
(45) Date of Patent: Dec. 21, 2004

(54) SEMICONDUCTOR INTEGRATED CIRCUIT HAVING LOGIC CIRCUIT COMPRISING TRANSISTORS WITH LOWER THRESHOLD VOLTAGE VALUES AND IMPROVED PATTERN LAYOUT

(75) Inventors: Susumu Takano, Tokyo (JP); Hiroyuki Takahashi, Tokyo (JP); Minoru Nizaka, Kanagawa (JP); Tomohiro Kitano, Kanagawa (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/357,752

(22) Filed: Feb. 4, 2003

(65) Prior Publication Data

US 2003/0112673 A1 Jun. 19, 2003

Related U.S. Application Data

(62) Division of application No. 09/741,304, filed on Dec. 19, 2000, now Pat. No. 6,545,892.

(30) Foreign Application Priority Data

Dec. 28, 1999 (JP) .......................................... 11-375831

(51) Int. Cl.[7] ................................................ G11C 5/02
(52) U.S. Cl. .............................. 365/51; 365/63; 326/87; 326/105
(58) Field of Search ....................... 365/51, 63, 230.06, 365/230.08; 326/101, 105, 106, 112, 83, 86, 87

(56) References Cited

U.S. PATENT DOCUMENTS 5,103,113 A * 4/1992 Inui et al. .................... 326/106
5,138,194 A * 8/1992 Yoeli ........................... 326/33
5,187,388 A * 2/1993 Moy ............................ 326/49
5,227,996 A * 7/1993 Uchida ........................ 365/72
5,386,153 A * 1/1995 Voss et al. .................... 326/34
5,412,331 A * 5/1995 Jun et al. .................... 326/105
5,793,695 A * 8/1998 Kohno ................... 365/230.06
6,078,195 A   6/2000 Chen .......................... 326/121
6,232,795 B1 * 5/2001 Takahashi et al. ............. 326/87
6,269,047 B1 * 7/2001 Kohno ................... 365/230.06
6,445,215 B1 * 9/2002 Takahashi et al. .......... 326/105
6,545,892 B2 * 4/2003 Takano et al. ................ 365/51

FOREIGN PATENT DOCUMENTS

| JP | 02-082716 | 3/1990 | ....... H03K/19/0185 |
| JP | 02-122726 | 5/1990 | ....... H03K/19/0948 |
| JP | 05-108194 | 4/1993 | ............. G06F/1/04 |
| JP | 06-208790 | 7/1994 | ......... G11C/11/407 |
| JP | 09-200036 | 7/1997 | .......... H03K/19/08 |
| JP | 10-125878 | 5/1998 | ......... H01L/27/118 |
| JP | 10-303370 | 11/1998 | ........... H01L/27/04 |
| JP | 11-017522 | 1/1999 | ....... H03K/19/0944 |
| JP | 11-340438 | 12/1999 | ......... H01L/27/108 |
| WO | WO 01/67609 | 9/2001 | .......... H03K/19/00 |

* cited by examiner

Primary Examiner—Gene Auduong
(74) Attorney, Agent, or Firm—Hayes Soloway P.C.

(57) ABSTRACT

A semiconductor integrated circuit including a logic circuit is disclosed, in which the decoder area can be reduced and which has an effect of reduction of the whole chip size. Among the MOS FETs included in the logic circuit, those other than a MOS FET for supplying electric charges via an output terminal have threshold voltage values lower than the threshold voltage value of the MOS FET for supplying electric charges. The direction of the gate width of each MOS FET is perpendicular to the direction along which word lines extend in the memory cell areas, and all of the MOS FETs are aligned in a direction perpendicular to the direction along which the word lines extend.

2 Claims, 13 Drawing Sheets

| EX | MX | $\overline{MX}$ | WL |
|---|---|---|---|
| 0 | 0 | 1 | 0 |
| 0 | 1 | 0 | 0 |
| 1 | 0 | 1 | 0 |
| 1 | 1 | 0 | 1 |

| EX | MX | $\overline{MX}$ | WL |
|----|----|----|----|
| 0 | 0 | 1 | 1 |
| 0 | 1 | 0 | 0 |
| 1 | 0 | 1 | 0 |
| 1 | 1 | 0 | 0 |

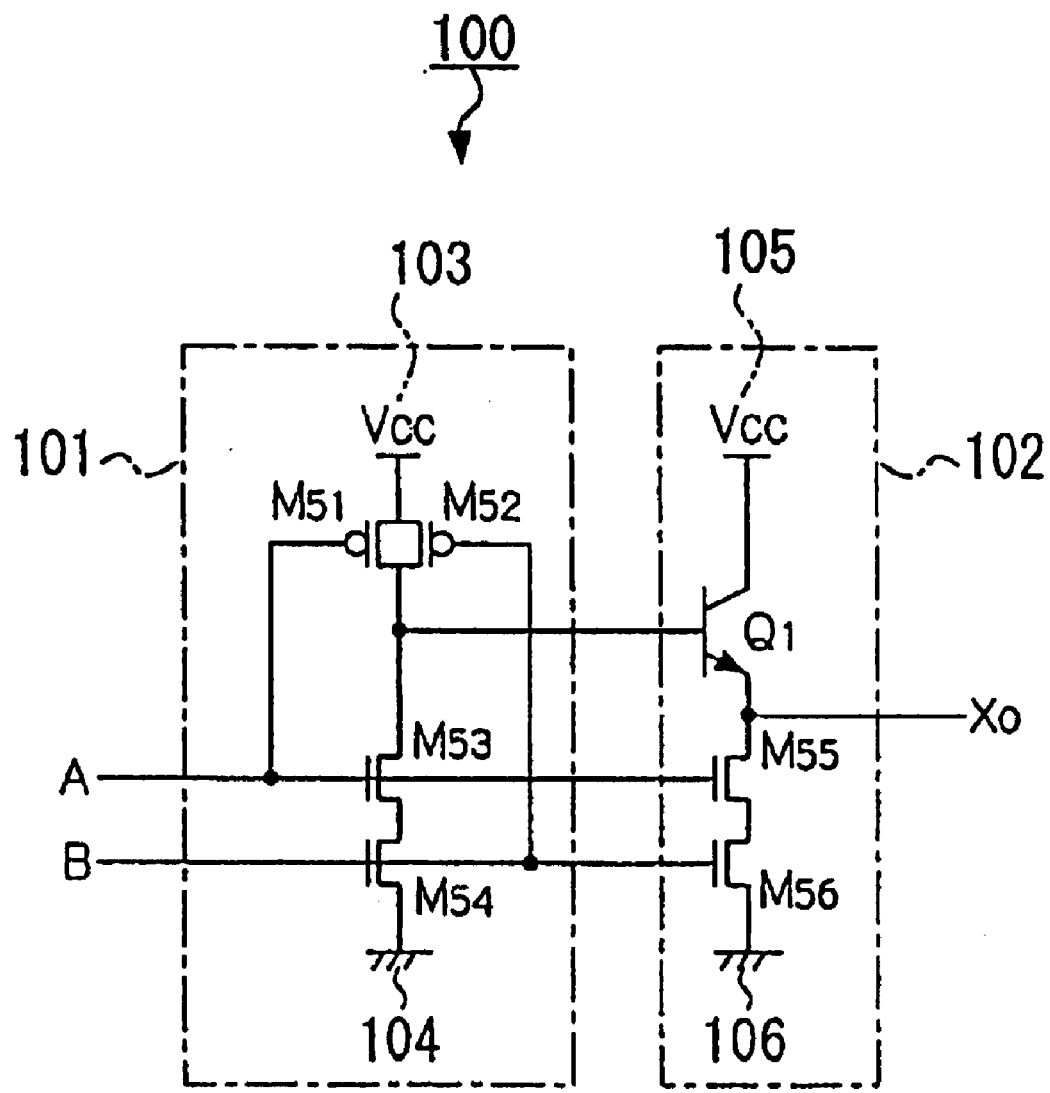

SEMICONDUCTOR INTEGRATED CIRCUIT HAVING LOGIC CIRCUIT COMPRISING TRANSISTORS WITH LOWER THRESHOLD VOLTAGE VALUES AND IMPROVED PATTERN LAYOUT

This application is a divisional application of U.S. application Ser. No. 09/741,304 filed Dec. 19, 2000, now U.S. Pat. No. 6,545,892.

BACKGROUND OF THE INVENTION

1. Field of the Invention

The present invention relates to a semiconductor integrated circuit, and in particular, to the structure and pattern layout of a logic circuit which is preferably applied to a decoder circuit of semiconductor memory devices or the like.

2. Description of the Related Art

Conventional decode circuits in semiconductor memory devices have the function of selecting a specific address in a memory cell, and the decoder circuits generally employ, for example, a two-input NAND circuit explained below. FIG. 12 is a circuit diagram showing an example of such a NAND circuit.

The shown NAND circuit 100 consists of a logic section 101 using CMOS transistors, and an output section 102 using bipolar and MOS transistors.

The logic section 101 includes a parallel-connected circuit employing two pMOS (i.e., p-channel MOS) transistors $M_{51}$ and $M_{52}$, and a serially connected circuit employing two nMOS (i.e., n-channel MOS) transistors $M_{53}$ and $M_{54}$. The parallel-connected circuit and the serially-connected circuit are further serially connected in this order between a high-potential power supply line 103 (i.e., voltage=Vcc) and an earth (or grounding) line 104.

Among two input signals A and B to be logically operated, signal A is input into the gate electrodes of pMOS transistor $M_{51}$ and nMOS transistor $M_{53}$, while signal B is input into the gate electrodes of pMOS transistor $M_{52}$ and nMOS transistor $M_{54}$. A signal resulting from this operation is output from a common drain electrode of pMOS transistors $M_{51}$ and $M_{52}$, and nMOS transistors $M_{53}$ and $M_{54}$ to output section 102.

In the output section 102, bipolar transistor (abbreviated to "BiP-Tr", hereinafter) $Q_1$ whose collector electrode is connected to the power supply line 105, and two nMOS transistors $M_{55}$ and $M_{56}$ are serially connected in this order between the power supply line 105 and earth line 106, as shown in FIG. 12. A logic signal from logic section 101 is input into the base electrode of BiP-Tr $Q_1$, and input signals A and B are respectively input into the gate electrodes of the nMOS transistors $M_{55}$ and $M_{56}$. This two-input Bi-CMOS NAND circuit uses the contact of the drain electrode of the nMOS transistor $M_{55}$ and the emitter electrode of the BiP-Tr $Q_1$ in the output section as an output terminal from which output signal $X_0$ is output.

In the NAND circuit 100 as shown in FIG. 12, when both signals A and B are high, the serially connected nMOS transistors $M_{53}$ and $M_{54}$ are on (i.e., in the ON states), while the parallel-connected pMOS transistors $M_{51}$ and $M_{52}$ are off (i.e., in the OFF states). As a result, the electric potential of the base electrode of the BiP-Tr $Q_1$ becomes ground level, so that the transistor is set to the OFF state. In addition, the serially connected nMOS transistors $M_{55}$ and $M_{56}$ are switched on, so that the electric charges of a load (not shown) are discharged via these transistors $M_{55}$ and $M_{56}$, and the level of the output signal $X_0$ becomes low.

In contrast, when signal A or B is low, one of the nMOS transistors $M_{53}$ and $M_{54}$ is off; thus, these nMOS transistors $M_{53}$ and $M_{54}$ have no effect on the decrease of the base potential of the BiP-Tr $Q_1$. Here, one of the pMOS transistors $M_{51}$ and $M_{52}$ is on; therefore, the above pMOS transistors $M_{51}$ and $M_{52}$ increase the electric potential of the base of the BiP-Tr $Q_1$. As a result, the voltage at the base of the BiP-Tr $Q_1$ is increased to Vcc, and the transistor is switched on. On the other hand, one of the serially connected nMOS transistors $M_{55}$ and $M_{56}$ is switched off, so that these transistors have no effect on the discharge from the output terminal. As a result, according to the charging operation using the BiP-Tr $Q_1$, the level of the output signal $X_0$ becomes high.

That is, the output from circuit 100 as shown in FIG. 12 is low only when both of the two inputs are high, and in other cases, the output is high based on the NAND logic. Decoder circuits provided in semiconductor storage devices or the like often employ logic circuits as explained above. Here, a feature of the circuit operation is that only one of arrayed NAND gates outputs a low level signal (i.e., LOW signal) as a selected output, and the others output high level signals (i.e., HIGH signals) as non-selected outputs. In the decoder circuit, a plurality of such gate structures are connected, and the memory cell designated by an input address can be selected.

In the above conventional NAND circuit, the level of the output signal can be made high by using the BiP-Tr $Q_1$ to which the base current is supplied using the pMOS transistors $M_{51}$ and $M_{52}$. Therefore, sufficient current can be supplied, and the operation speed can be high. However, the level of the output signal can be made low by (i) decreasing the potential of the base of the BiP-Tr $Q_1$ by using the serially connected nMOS transistors $M_{53}$ and $M_{54}$, and (ii) drawing electric charges (i.e., current) from an output load by using the serially connected nMOS transistors $M_{55}$ and $M_{56}$. This means that in the nMOS transistor, the equivalent gate length is double while the current supplying ability is half, compared with the other cases.

In order to compensate for the reduction (by half) of the current supplying ability, generally, the gate width of the nMOS transistor is designed to be wider so as to improve the current supplying ability and to prevent a delay in the speed of the drop in potential. However, the increase of the gate width causes an increase of the input capacitance observed from the input signal side; thus, the operation speed of the logic circuit as the former stage is decreased. That is, in order to improve the operation speed of a circuit having a plurality of logic gates, it is necessary to improve the fan-out characteristics (i.e., the relationship between the ratio of the capacitance of the output (load) to the capacitance of the input, and the delay time). However, the degradation of the current supplying ability of the serially connected nMOS transistors is an obstacle which must be overcome to improve the fan-out characteristics. In addition, the increase of the gate width obviously causes an increase of the area of the logic circuit.

As for the decoder circuit, the speed of the selecting operation, which is a characteristic operation of this circuit, depends on the delay time of the output selected signal. Here, the selecting operation is performed by decreasing the output level by using serially connected nMOS transistors (or by increasing the output level by using serially connected pMOS transistors in case of a NOR circuit). Therefore, the decrease of the current supplying ability with respect to the serially connected MOS transistors has a considerable effect on the operation speed.

In order to solve the operational delay, increase of the occupied area, and the like in such logic circuits, the inventors of the present invention proposed the logic circuit, having a structure as shown in FIGS. 13 and 14, which is disclosed in Japanese Unexamined Patent Application, First Publication, No. Hei 9-200036.

In the conventional circuit shown in FIG. 12, each of the current path for decreasing the potential of the base of the BiP-Tr $Q_1$ and the current path for drawing electric charges from an output load is formed using two serially connected nMOS transistors. In contrast, the circuit 200 in FIG. 13, each path (here, the BiP-Tr $Q_2$ is used) is formed using a single nMOS transistor $M_{63}$ or $M_{64}$. Among two input signals A and B, $\nabla$B (here, $\nabla$ represents an upper bar indicating inversion, hereinafter), the inverted signal of input signal B, is input into the source electrodes of the nMOS transistors $M_{63}$ and $M_{64}$. The same logic as that realized in the circuit shown in FIG. 12 can also be realized in the circuit 200. In the structure of circuit 200, the input capacitance is half as much as that of the conventional gate-input capacitance, and the fan-out characteristics can be improved. Additionally, the nMOS transistor $M_{64}$ functions as a transfer gate; thus, current drawing from the output terminal is started before the ON operation by the gate input. Therefore, the operation speed of the whole circuit (also including the logic circuit) can be very high. However, in this structure, the load capacitance at the output terminal is discharged via a wiring line of $\nabla$B, an input signal. Therefore, in order to perform a high speed operation, it is necessary to satisfy a condition that the load capacitance of inverted signal $\nabla$B is larger than the load capacitance of the output terminal. In comparison with the conventional circuit using 7 transistors, only 5 transistors are used in the whole circuit in the present example, thereby reducing the occupied area of the logic circuit.

The circuit 300 as shown in FIG. 14 has the same structure of the NAND logic circuit as that of the NAND circuit using a bipolar CMOS structure as shown in FIG. 13, but has the difference that a CMOS inverter is added to the output point of the NAND circuit so as to form an AND logic circuit. The load driving ability of CMOS circuits is generally lower than that of bipolar CMOS circuits. Therefore, in order to drive a large load, an inverter for driving the same is connected to the logic circuit. In the decoder circuit using the present structure, most of the decoder outputs are not selected, and only at the selected output, the output load of the NAND logic can be active via the source electrode of the NMOS transistor. In this case, the load capacitance of the relevant NAND output only corresponds to the input capacitance of the CMOS inverter for the driving operation; therefore, almost all of the load capacitance of the decoder outputs corresponds to the sum of the input and wiring capacitance of the non-selected channels. Therefore, the above conditions for improving the operation speed can be easily satisfied, and the high-speed operation can be efficiently performed. Also in this circuit, the number of necessary transistors can be decreased from 7 (in the conventional case) to 5, thereby reducing the occupied area of the logic circuit.

As explained above, the circuits as shown in FIGS. 13 and 14 are effective for improving the operation speed, but still insufficient for reducing the occupied area. In semiconductor storage devices, the memory cell area having regularly arrayed elements has been reduced because the size of each cell has been reduced; however, in the peripheral circuit area including the decoder circuit, area reduction remains difficult because the relevant elements are not regularly arranged. The demand for reduction of chip size has increased, and reduction of the occupied area of peripheral circuits such as the decoder circuit has received much attention.

SUMMARY OF THE INVENTION

In consideration of the above circumstances, an objective of the present invention is to provide a semiconductor integrated circuit in which the area of the logic circuit is reduced so that the area of the peripheral circuits such as the decoder circuit can be reduced, thereby reducing the chip size.

Therefore, the present invention provides a semiconductor integrated circuit having a logic circuit which comprises:
one or more first transistors for supplying electric charges to an external load via an output terminal; and
one or more second transistors for drawing electric charges from the load via the output terminal, and wherein:
in the logical operation of the logic circuit, the above supply and drawing of electric charges are executed according to combination of the states of a plurality of binary logic signals input from an external device; and
among all the transistors in the logic circuit, each transistor other than the first transistors for supplying electric charges has a threshold voltage value lower than that of each first transistor.

The inventors of the present invention worked to reduce the occupied area of a conventional AND logic circuit (as shown in FIG. 14), and found that the size of each MOS FET as a constituent of the logic circuit can be reduced by reducing the threshold voltage value (called Vth, hereinbelow) of the FET, and accordingly, the size of the whole circuit can be reduced. That is, to reduce Vth of the MOS FET causes an increase of current flowing when a predetermined voltage is applied to the gate electrode, so that the ability to drive a transistor is improved and a smaller gate width is sufficient for providing a specific current. Therefore, according to the reduction of the threshold voltage value Vth of the MOS FETs in the logic circuit, the size of each transistor can be reduced and the occupied area of the whole logic circuit can be reduced.

According to the above, it is most preferable that Vth of all of the MOS FETs in the logic circuit be reduced. However, this cannot be realized in some kinds of logic circuits. This is due to a strong demand of reduction of power consumption as well as the reduction of the chip size in the current development of semiconductor integrated circuits.

For example, when the circuit shown in FIG. 14 is used as a decoder circuit, the output terminal is connected to a word line, and when the output to the word line is low (i.e., the signal level is low), the operation is in a standby mode. Under this condition, the nMOS transistor for drawing electric charges from the word line is on while the pMOS transistor for supplying electric charges to the word line is off. If it is assumed that the threshold voltage value Vth of the pMOS transistor for supplying electric charges be reduced (according to the above-considered reduction of all the MOS FETs), then the leakage current of the relevant pMOS transistor in the OFF state is considerably increased because a high voltage Vcc is directly applied to the source electrode of the pMOS transistor. This increase of the leakage current causes an increase of the standby current, thereby increasing the power consumption. Accordingly, Vth of the transistor for supplying electric charges, which is in the OFF state in the standby mode of the circuit operation and which is connected to high voltage Vcc, cannot be reduced.

Generally, such a logic circuit is formed using transistors having a specific Vth. However, in the present invention, low and high threshold voltage values Vth (the high value corresponds to the above specific Vth which is generally used) are used in a single circuit, that is, a "multi-Vth" method is applied to such a logic circuit. Accordingly, the gate width of each transistor having a low Vth can be reduced in comparison with the conventional case, thereby reducing the occupied area of the whole circuit.

The present invention also provides a more specific semiconductor integrated circuit having an AND logic circuit which comprises:

a NAND circuit which includes:
parallel-connected first and second p-channel MOS FETs, where first and second input signals are respectively input into the gate electrodes of the FETs; and
a first n-channel MOS FET, where the first input signal is input into the gate electrode and an inverted signal of the second input signal is input into the source electrode, and
wherein the common drain electrode of the first and second p-channel MOS FETs and the drain electrode of the first n-channel MOS FET are connected; and an inverter circuit having a complementary MOS transistor structure for receiving an output signal from the NAND circuit and outputting an inverted signal of the received signal from an output terminal, where the complementary MOS transistor structure comprises a third p-channel MOS FET and a second n-channel MOS FET, and
wherein among all the MOS FETs in the AND logic circuit, each FET other than the third p-channel MOS FET has a threshold voltage value lower than the threshold voltage value of the third p-channel MOS FET.

This structure is obtained by applying the concept of the present invention to the AND logic circuit as shown in FIG. 14 (which is a previous invention of the inventors). Among the five transistors (three pMOS FETs and two nMOS FETs), the threshold voltage value Vth of each of the four transistors other than the third pMOS FET can be reduced, thereby sufficiently reducing the occupied area of the whole logic circuit.

The present invention also provides another specific semiconductor integrated circuit having an AND logic circuit which comprises:

a NAND circuit which includes:
a first pMOS FET, where a fixed electric potential is applied to the gate electrode so as to keep the first MOS FET on; and
a first n-channel MOS FET, where a first input signal is input into the gate electrode and a second inverted input signal is input into the source electrode, and
wherein the drain electrode of the first p-channel MOS FET and the drain electrode of the first n-channel MOS FET are connected; and an inverter circuit having a complementary MOS transistor structure for receiving an output signal from the NAND circuit and outputting an inverted signal of the received signal from an output terminal, where the complementary MOS transistor structure comprises a second p-channel MOS FET and a second n-channel MOS FET, and
wherein among all the MOS FETs in the AND logic circuit, each FET other than the second p-channel MOS FET has a threshold voltage value lower than the threshold voltage value of the second p-channel MOS FET.

In this structure, only two input signals, the first input signal and the second inverted input signal are necessary, and the number of necessary transistors can be reduced by one in comparison with the previous structure. Accordingly, the occupied area of the logic circuit can be further reduced also by reducing the threshold voltage value Vth.

The present invention also provides a semiconductor integrated circuit having a NOR logic circuit which comprises:

a first pMOS FET, where a first input signal is input into the gate electrode and an inverted signal of a second input signal is input into the source electrode; and
parallel-connected first and second nMOS FETs, where the first and second input signals are respectively input into the gate electrodes of the FETs, and wherein:
the drain electrode of first pMOS FET and the common drain electrode of the first and second nMOS FETs are connected; and
the threshold voltage value of each of the MOS FETs in the NOR logic circuit may be decreased.

The NOR logic circuit having the above structure has a relatively high ability to drive a load; thus, no inverter circuit for driving a load is necessary. In addition, this logic circuit includes no transistor (for supplying electric charges) which is off in the operation-standby mode and which is connected to a high voltage Vcc. Therefore, all of the transistors can have low threshold voltage value Vth, and have an effect on the reduction of the occupied area of the logic circuit.

The logic circuits as explained above may be applied to a decoder circuit.

The present invention also provides a semiconductor integrated circuit comprising:

a decoder area, positioned between adjacent memory cell areas, having one or more p-channel MOS FETs and one or more n-channel MOS FETs, wherein:
each of the p-channel MOS FETs and n-channel MOS FETs is arranged in a manner such that the direction of the gate width is perpendicular to the direction along which word lines extend in the memory cell areas.

As explained above, in the logic circuits according to the present invention which include transistors having low threshold voltage values Vth, the gate width of each relevant transistor can be reduced. Therefore, even if each transistor is arranged in a decoder area in a manner such that the direction of the gate width is perpendicular to the direction along which the word lines extend (that is, arranged in the longitudinal direction), all the transistors can be arranged within the longitudinal range of a predetermined number of memory cells, so that the occupied area of the whole decoder area can be reduced.

In the above structure, the p-channel MOS FETs and the n-channel MOS FETs may be aligned in a direction perpendicular to the direction along which word lines extend in the memory cell areas, in a manner such that the p-channel MOS FETs and the n-channel MOS FETs face each other.

In the general conventional arrangement of the decoder area, the p-channel MOS FETs and the n-channel MOS FETs are aligned in the transverse direction, that is, in a direction parallel to the direction along which word lines extend in the memory cell areas. In contrast, in the decoder area of the semiconductor integrated circuit according to the present invention, the conventional arrangement can be rotated by 90 degrees, so that the width (in the direction along which the word lines extend) of the decoder area between the memory cell areas can be reduced.

In the general decoder area, a main power supply line for supplying electric power is provided in and along each boundary between the decoder area and each of the memory cell areas. However, if the the p-channel MOS FETs and the n-channel MOS FETs are aligned in a direction parallel to the direction along which the word lines extend, then power supply lines can extend from each main power supply line towards the area where the p-channel MOS FETs are formed, but cannot pass through the area where the n-channel MOS FETs are formed. Therefore, the main power supply lines which face each other via the decoder area cannot be connected.

In contrast, in the present invention, the p-channel MOS FETs and the n-channel MOS FETs are aligned in a direction perpendicular to the direction along which word lines extend in the memory cell areas, in a manner such that the p-channel MOS FETs and the n-channel MOS FETs face each other. In this case, power supply lines (first sub power supply lines) which cross the decoder area and extend parallel to the direction along which the word lines extend can be provided in the area where the p-channel MOS FETs are formed, so as to connect the main power supply lines using the first sub power supply lines. As a result, the voltage drop in the power supply lines can be reduced, and the resistance of the power supply lines can be reduced, thereby providing improved power supply lines. In addition, the width of each power supply line can be reduced.

In addition, the main power supply lines at both sides of a memory cell area may be connected via second sub power supply lines which cross the memory cell area. Accordingly, over the whole chip area of the semiconductor integrated circuit, power supply lines are arranged and electrically connected, thereby forming a wiring network. Therefore, the power supply lines can be much more efficiently arranged, and the above-explained effects can be much more easily obtained.

The above-explained wiring structure can also be applied to earth lines.

That is, when a main earth line for grounding is provided in and along each boundary between the decoder area and each of the memory cell areas, the main earth lines in the boundaries can be connected via first sub earth lines which cross the decoder area and extend parallel to the direction along which the word lines extend.

In addition, the main earth lines at both sides of a memory cell area can be connected via second sub earth lines which cross the memory cell area, and the main earth lines, and the first and second sub earth lines may form a wiring network for grounding over the whole chip area of the semiconductor integrated circuit.

In the above-explained distinctive pattern layout of the decoder area, the p-channel MOS FETs and the n-channel MOS FETs may form a NAND circuit, an AND logic circuit comprising a NAND circuit and an inverter circuit, NOR circuit, or the like.

As explained above, according to the present invention, the area of the logic circuit can be reduced, thereby reducing the area of the decoder circuit, peripheral circuit, or the like. Therefore, it is possible to provide a semiconductor integrated circuit which has an effect on the reduction of the chip size. In addition, the operation speed can be improved in comparison with the conventional circuit structure.

BRIEF DESCRIPTION OF THE DRAWINGS

FIG. 12 is a circuit diagram showing a conventional logic circuit using a bipolar transistor.

DESCRIPTION OF THE PREFERRED EMBODIMENTS

Figure 1:
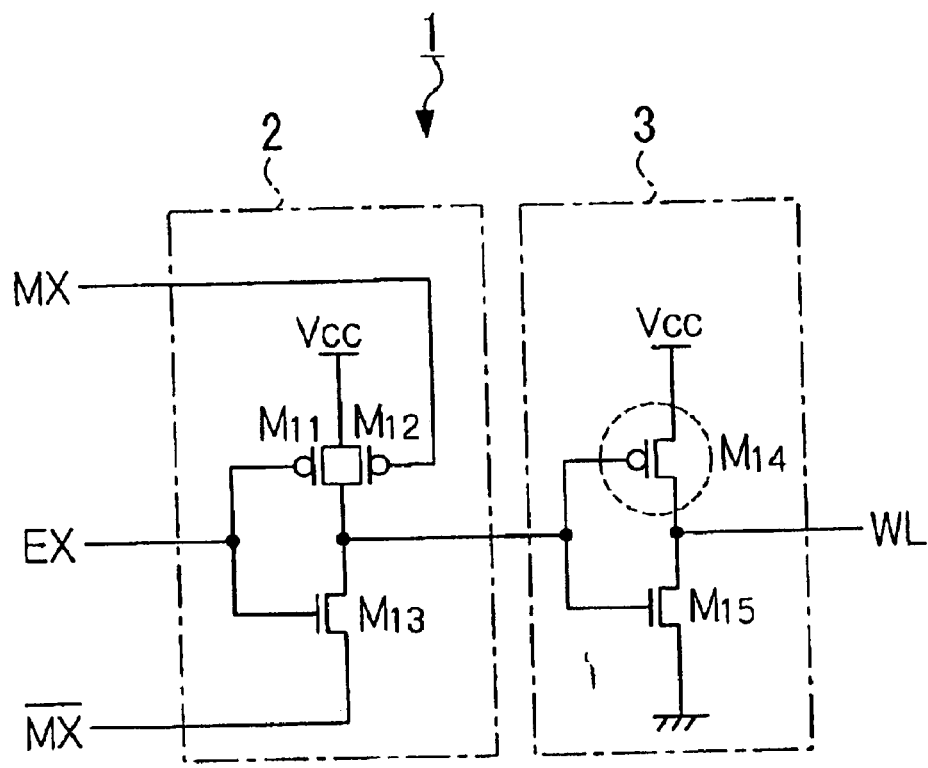
FIG. 1A is a circuit diagram showing an AND logic circuit employed in the semiconductor integrated circuit of the first embodiment according to the present invention.
FIG. 1B is a truth table of the logic circuit.
Figure 2:
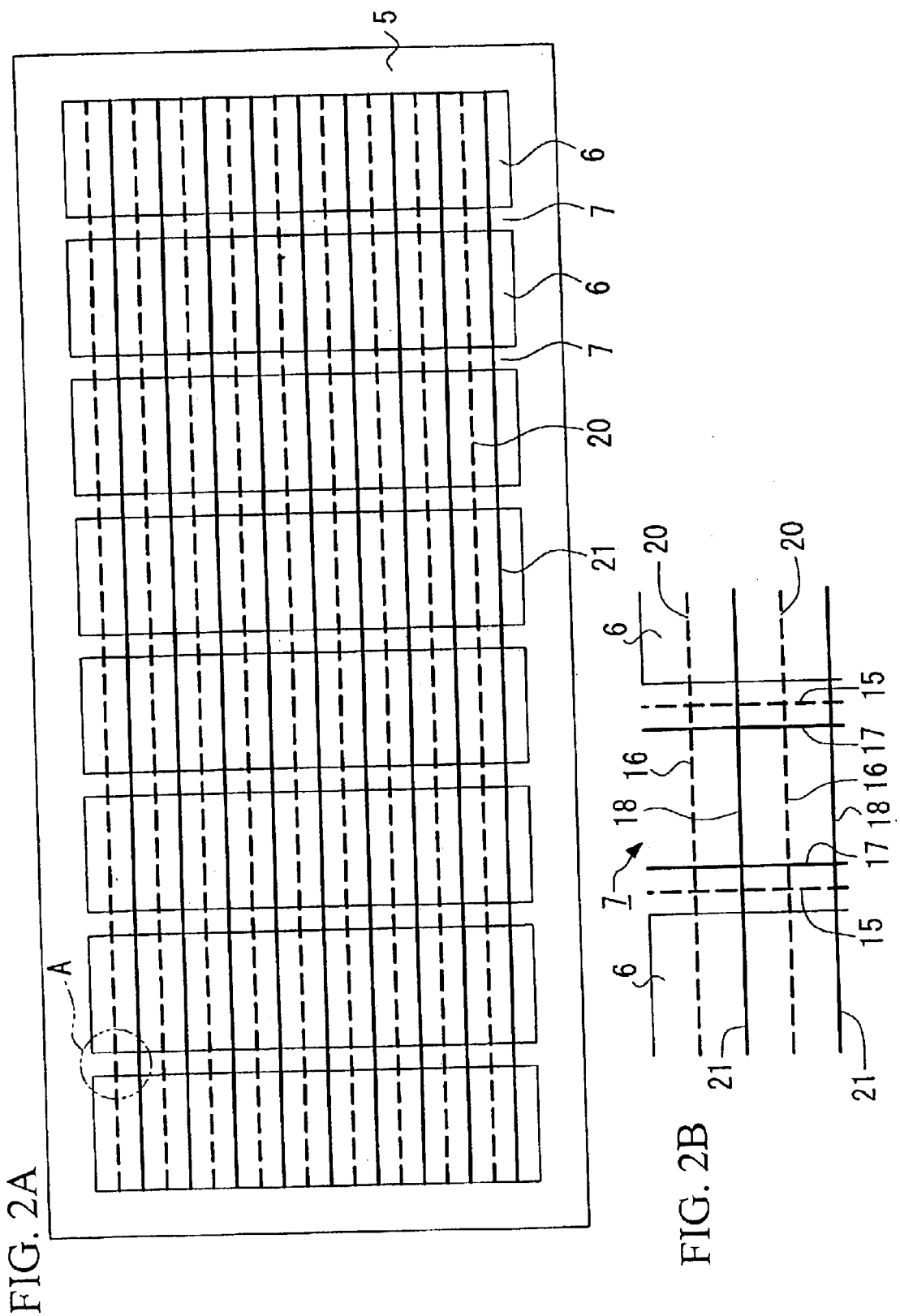
FIG. 2A is a diagram-showing the general structure of the chip of the semiconductor integrated circuit in the first embodiment.
FIG. 2B is an enlarged view of a part surrounded by circle A in FIG. 2A.

Hereinafter, embodiments according to the present invention will be explained in detail with reference to the drawings.

First Embodiment

The first embodiment of the present invention will be explained with reference to FIGS. 1A to 7.

FIG. 1A is a circuit diagram showing a logic circuit employed in the decoder circuit of the semiconductor integrated circuit of the present embodiment, and FIG. 1B is a truth table of the logic circuit. This logic circuit has an AND logic structure of a combination of a NAND circuit using a CMOS structure, and an inverter circuit.

As shown in FIG. 1A, the AND logic circuit 1 in the present embodiment comprises parallel-connected pMOS transistor $M_{11}$ (corresponding to the first p-channel MOS FET (field effect transistor) of the present invention) and pMOS transistor $M_{12}$ (corresponding to the second p-channel MOS FET of the present invention), and input signals EX (corresponding to the first input signal of the present invention) and MX (corresponding to the second input signal of the present invention) are respectively input into the gate electrodes of the pMOS transistors $M_{11}$ and $M_{12}$. The input signal EX is also input into an nMOS transistor $M_{13}$ (corresponding to the first n-channel MOS FET of the present invention), and another input signal $\nabla$MX (corresponding to the inverted signal of the second input signal of the present invention) is input into the source electrode of the nMOS transistor $M_{13}$. The common drain electrode of the parallel-connected pMOS transistor $M_{11}$ and $M_{12}$ and the drain electrode of the nMOS transistor $M_{13}$ are connected, and the connection point thereof functions as the output point of NAND circuit 2.

The above NAND output is input into inverter circuit 3 having a CMOS structure, which comprises pMOS transistor $M_{14}$ (corresponding to the third p-channel MOS FET of the present invention) and nMOS transistor $M_{15}$ (corresponding to the second n-channel MOS FET of the present invention). The output from the inverter circuit 3 functions as output signal WL of the AND logic circuit.

Among the 5 MOS transistors (i.e., MOS FETs) used in the AND logic circuit 1 of the present embodiment, the threshold voltage values Vth of the four transistors other than the pMOS transistor $M_{14}$ are lower than the threshold voltage value Vth of the pMOS transistor $M_{14}$. For example, the threshold voltage value Vth (here, the absolute value) of the pMOS transistor $M_{14}$ is set to approximately 0.7 to 0.8 V, while the threshold voltage values Vth (also, the absolute values) of the other transistors are approximately 0.5 to 0.55 V. Accordingly, the gate width of each MOS transistor is designed as follows: 3 μm for pMOS transistor $M_{11}$, 0.7 μm for pMOS transistor $M_{12}$, 2 μm for nMOS transistor $M_{13}$, 6 μm for pMOS transistor $M_{14}$, and 4 μm for nMOS transistor $M_{15}$.

As shown in FIG. 1B, in the logical operation of the above AND logic circuit 1, when the input signal EX is low (i.e., 0: low level), the pMOS transistor $M_{11}$ is on (i.e., in the ON state), the nMOS transistor $M_{13}$ is off (i.e., in the OFF state), and the NAND output is high (i.e., 1: high level), so that the output of the inverter, that is, the AND output is low (0). On the other hand, when the input signal EX is high (1), the pMOS transistor $M_{11}$ is off. In this case, the pMOS transistor $M_{12}$ is on if the input signal MX is low (0), and the nMOS transistor $M_{13}$ is off because the input signal $\nabla$MX is high (1), so that the NAND output is high (1) and the AND output is low (0), Only when both the input signals EX and MX are high (1), both the pMOS transistors $M_{11}$ and $M_{12}$ are off, and the nMOS transistor $M_{13}$ is on because the input signal $\nabla$MX is low, so that the NAND output is low (0) and the AND output is high (1).

That is, the output from the logic circuit 1 of the present embodiment is (i) high only when both the input signals EX and MX are high, and (ii) low in the other cases, based on the AND logic. Therefore, if a plurality of logic circuits 1 (e.g., 8 logic circuits 1) are arranged, only one of them has a HIGH output, that is, the selected output, and the others have LOW outputs, that is, non-selected outputs, so that a decoder circuit can be realized.

Below, the structure of the chip of the semiconductor integrated circuit in the present embodiment will be explained.

FIG. 2A is a diagram showing the general structure of chip 5, and FIG. 2B is an enlarged view of a part surrounded by circle A in FIG. 2A. A plurality of memory cell areas 6 are provided, and the area between adjacent memory cell areas 6 functions as a poly-decoder area (corresponding to the decoder area according to the present invention) 7. The number of decoder lines (not shown in FIG. 2A) is generally, 2, 4, or 8. In the present embodiment, 8 decoder lines are provided. Accordingly, in the memory cells arranged in the longitudinal direction, the memory cells at 8-cell intervals are selected by a specific (i.e., the same) decoder line.

In the present explanations, the longitudinal direction is perpendicular to word lines which pass through memory cell areas 6 and are parallel to lines 20 and 21 explained later, while the transverse direction is parallel to the word lines.

FIGS. 2A and 2B mainly show a wiring arrangement of power supply lines and earth lines, which will be explained later.

FIGS. 3 to 6 show example patterns of an actual integrated circuit, to which the above AND logic circuit 1 is applied. The present semiconductor integrated circuit has a three-layered wiring structure.

Figure 3:
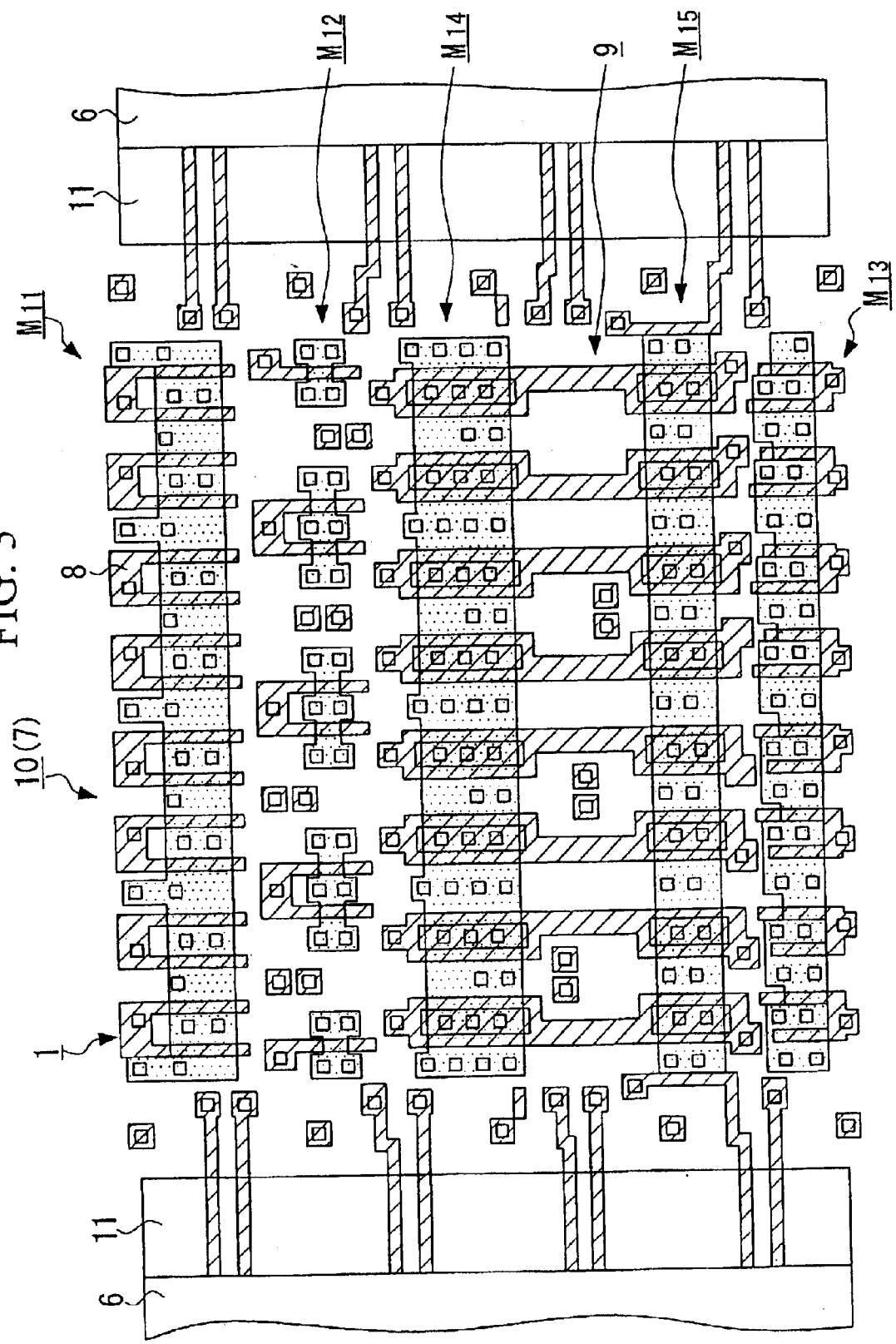
FIG. 3 shows the pattern layout of the decoder area of the semiconductor integrated circuit in the first embodiment, and in particular, shows the lowest-layer MOS transistor including a polysilicon gate pattern.
Figure 4:
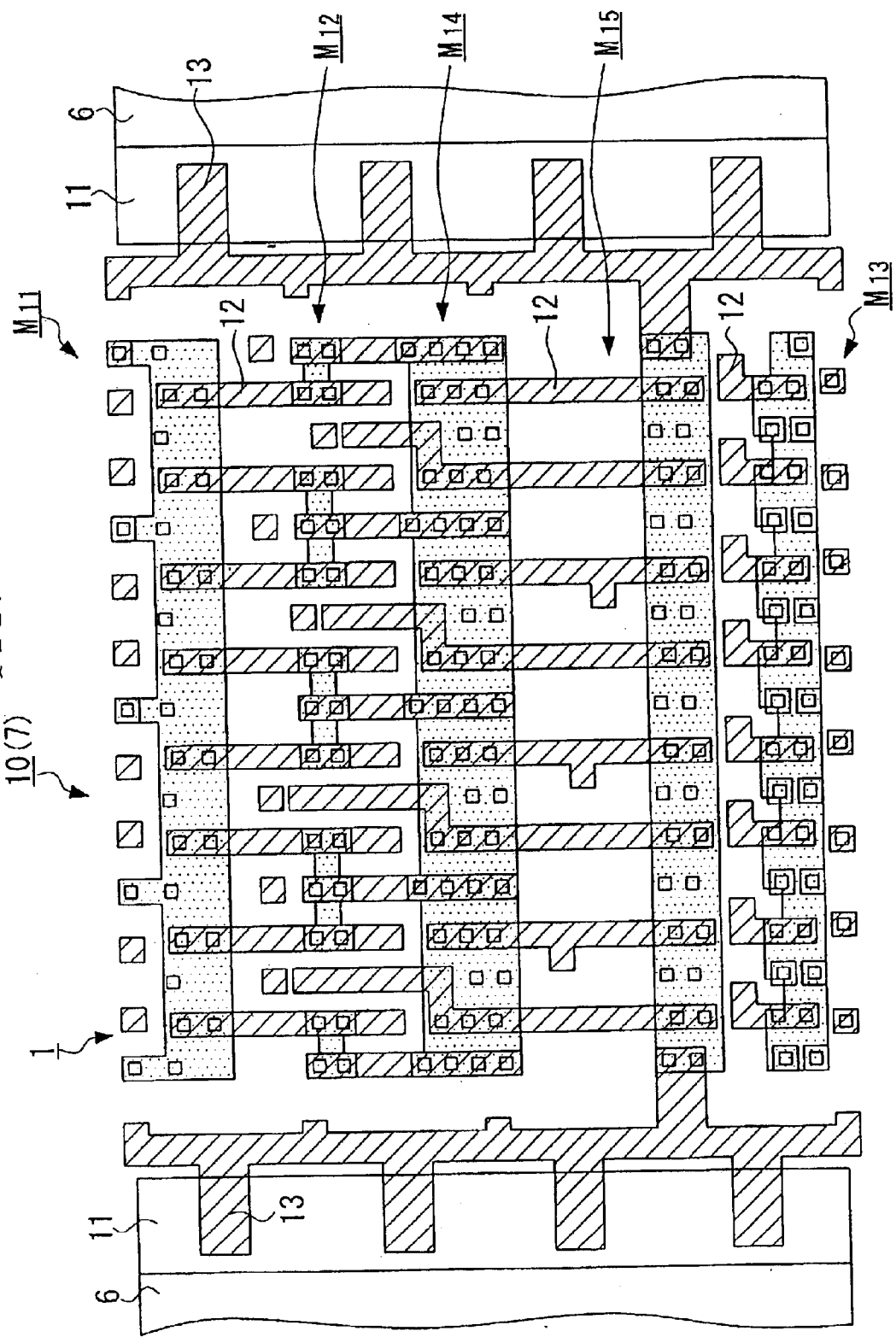
FIG. 4 also shows the pattern layout of the decoder area, and in particular, shows the MOS transistor and the first metal wiring pattern.
Figure 5:
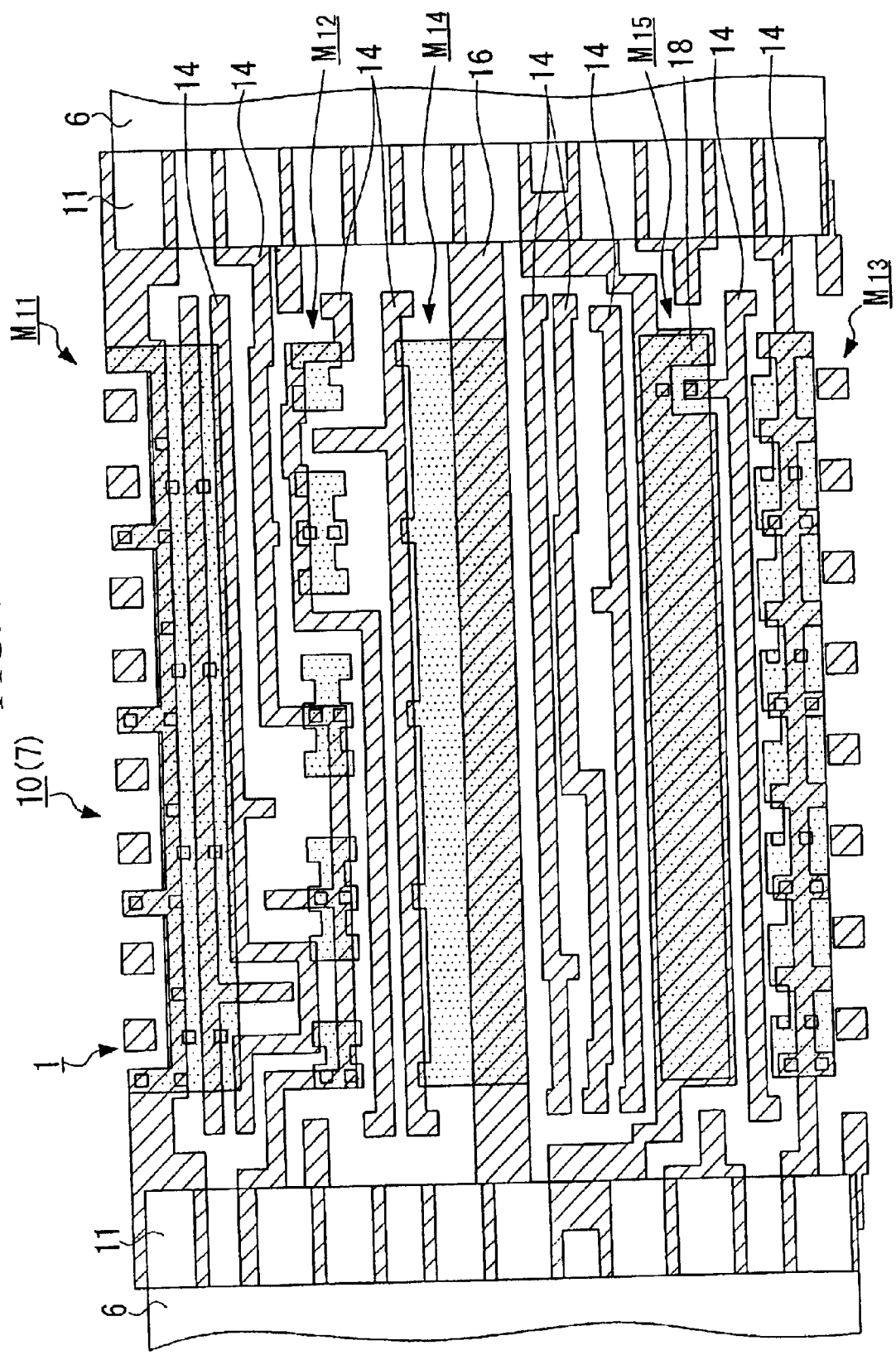
FIG. 5 also shows the pattern layout of the decoder area, and in particular, shows the MOS transistor and the second metal wiring pattern.
Figure 6:
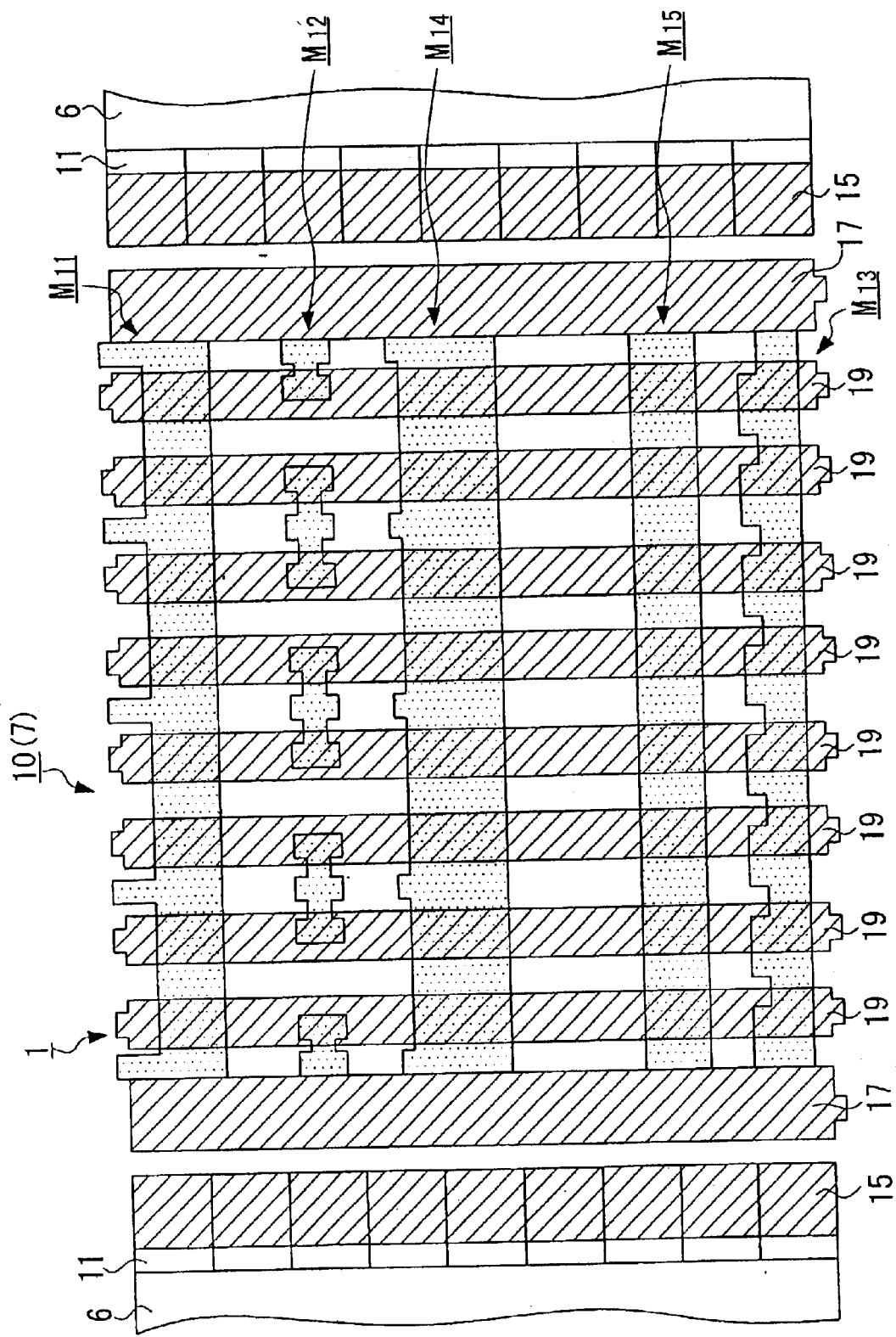
FIG. 6 also shows the pattern layout of the decoder area, and in particular, shows the MOS transistor and the third metal wiring pattern.

FIG. 3 shows the lowest-layer MOS transistor including a polysilicon gate pattern, FIG. 4 shows the MOS transistor and the first metal wiring pattern, FIG. 5 shows the MOS transistor and the second metal wiring pattern, and FIG. 6 shows the MOS transistor and the third metal wiring pattern. Here, the three layers are called the first metal wiring layer, the second metal wiring layer, and the third metal wiring layer from the bottom.

As shown in FIG. 3, three pMOS transistors $M_{11}$, $M_{12}$, and $M_{14}$, and two nMOS transistors $M_{13}$ and $M_{15}$ are separated into the pMOS transistor side and the nMOS transistor side, and the two sides face each other, in other words, the two sides are arranged and aligned in the longitudinal direction. The five MOS transistors, which form a logic circuit, are arranged in the longitudinal direction. From the upper side, there are (i) pMOS transistor $M_{11}$ having a gate width of 3 μm, (ii) pMOS transistor $M_{12}$ having a gate width of 0.7 μm, (iii) pMOS transistor $M_{14}$ having a gate width of 6 μm, (iv) nMOS transistor $M_{15}$ having a gate width of 4 μm, and (v) nMOS transistor $M_{13}$ having a gate width of 2 μm. Only pMOS transistor $M_{14}$ does not have a low threshold voltage value (Vth); thus, this transistor has the largest size.

In the present embodiment, the gate pattern 8 of each MOS transistor has a U-shape (i.e., folded shape) so as to obtain a large current using a small area. Therefore, the gate width of each MOS transistor has a longitudinal direction. In addition, pMOS transistor $M_{14}$ and nMOS transistor $M_{15}$ form an inverter circuit 3; thus, the wiring contact indicated by reference numeral 9 functions as the output of the relevant AND logic circuit 1, and the wiring contact 9 and word lines (not shown) in each memory cell area 6 are connected. Here, 8 AND logic circuits 1, each having 5 MOS transistors arranged in the longitudinal direction as explained above, are arranged in the transverse direction, thereby forming decoder circuit 10. In addition, reference numerals 11 indicate dummy cell areas.

As shown in FIG. 4, in the first wiring layer, the first metal wiring lines 12 for connecting each MOS transistor extend in the longitudinal direction. In addition, earth lines 13 connected to the nMOS transistors $M_{15}$ are provided at edge sides of poly-decoder area 7.

As shown in FIG. 5, in the second wiring layer, there are the following lines in the transverse direction: (i) the second metal wiring lines 14 functioning as signal lines for supplying signals to the memory cell areas 6, (ii) the second metal power supply line 16 (corresponding to the first sub power supply line of the present invention) for connecting the third metal power supply lines 15 (explained later, corresponding to the main power supply lines of the present invention) with each other in the poly-decoder area 7, and (iii) the second metal earth line 18 (corresponding to the first sub earth line of the present invention) for connecting the third metal earth lines 17 (explained later, corresponding to the main earth lines of the present invention) with each other in the poly-decoder area 7.

As shown in FIG. 6, in the third or top wiring layer, 8 third metal decoder lines 19 are provided in the longitudinal direction in a main central area, and at the both sides of this area, the third metal power supply lines 15 and the third metal earth lines 17 are provided also in the longitudinal direction. For example, the line width of the third metal decoder line 19 is approximately 1.3 μm, and the space between the lines is approximately 1.5 μm.

The wiring pattern of the decoder area has been explained above. As shown in FIG. 2B, the third metal power supply lines 15 are positioned at both sides of each memory cell area 6, and the second metal power supply lines (corresponding to the second sub power supply lines of the present invention) 20 are provided for connecting the third metal power supply lines 15 with each other. Here, the second metal power supply lines 20 cross the memory cell areas 6. In addition, the second metal power supply lines 16 cross the poly-decoder area 7. Accordingly, power supply lines (indicated by broken lines in FIGS. 2A and 2B) are spread and active over the whole area of the chip.

Similarly, the second earth lines (corresponding to the second sub earth lines of the present invention) 21 are provided for connecting the third metal earth lines 17 with each other, and these second earth lines cross the memory cell areas 6. According to the second earth lines 21 and the second metal earth lines 18, earth lines (indicated by solid lines in FIGS. 2A and 2B) are spread and active over the whole area of the chip.

In the pattern employed in the poly-decoder area 7 in the present embodiment, 4 MOS transistors $M_{11}$, $M_{12}$, $M_{13}$, and $M_{15}$ have low threshold voltage values Vth, thereby reducing the necessary area. Accordingly, as shown in FIG. 6, within the longitudinal range corresponding to 8 memory cells (arranged in the longitudinal direction), the transistors used in the decoder circuit 10 (comprising 8 AND logic circuits 1) are arranged in the area where 8 third metal decoder lines 9 are provided.

Figure 9:
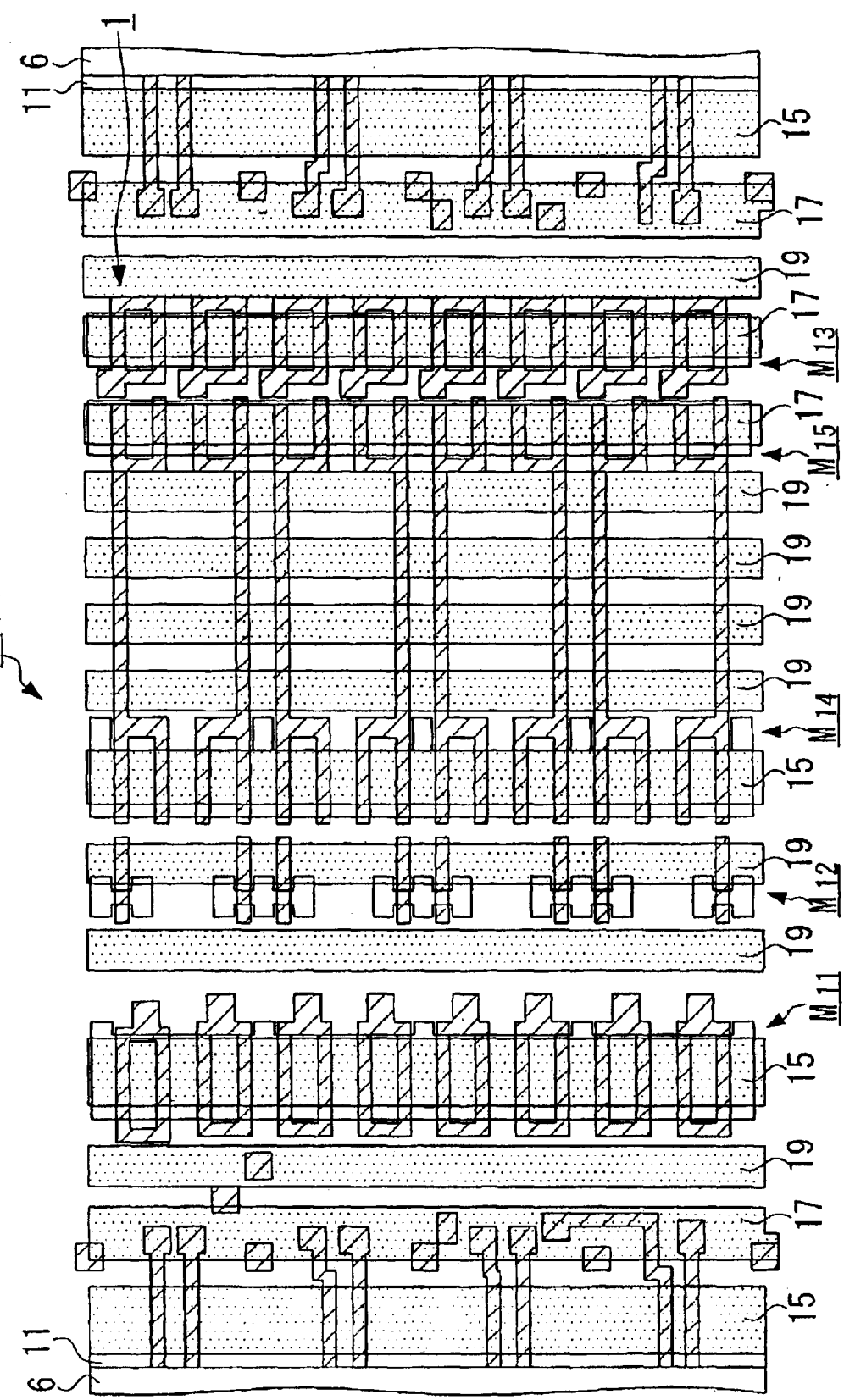
FIG. 9 shows a pattern layout of the decoder area of the semiconductor integrated circuit, and in particular, shows the lowest-layer MOS transistor and the third metal wiring pattern.

Here, it is assumed that low threshold voltage values Vth are not employed in the AND logic circuit shown in FIG. 1 in the present embodiment, and FIG. 9 shows the pattern layout in this assumed case. That is, FIG. 9 is a diagram (corresponding to FIG. 6 of the present embodiment) showing only 5 transistors which form the AND logic circuit 1 and the third metal wiring lines. In FIG. 9, parts identical to those in FIG. 6 are given identical reference numerals, so as to clearly show corresponding parts.

Here, it is assumed that the threshold voltage values Vth of all of the five transistors are set to a general level, that is, 0.7 to 0.8 V. In this case, in order to obtain a driving ability similar to that of the present embodiment, the gate width of pMOS transistor $M_{11}$ should be 4 μm, the gate width of pMOS transistor $M_{12}$ should be 0.7 μm, the gate width of pMOS transistor $M_{14}$ should be 6 μm, the gate width of nMOS transistor $M_{13}$ should be 3 μm, and the gate width of nMOS transistor $M_{15}$ should be 6 μm. That is, the gate widths are generally larger than those of the present invention; thus, if the pMOS transistors $M_{11}$, $M_{12}$, and $M_{14}$, and nMOS transistors $M_{13}$ and $M_{15}$ are arranged in the longi-tudinal direction as in the present embodiment, the relevant transistors cannot be arranged within the longitudinal range corresponding to 8 memory cells (arranged in the longitudinal direction) and thus the desired circuit cannot be formed. Therefore, in order to arrange the transistors within such a longitudinal range including 8 memory cells, the pMOS transistors $M_{11}$, $M_{12}$, and $M_{14}$, and the nMOS transistors $M_{13}$ and $M_{15}$ must face each other or be arranged or aligned in the transverse direction, as shown in FIG. 9. That is, generally, the pattern layout shown in FIG. 1 of the present embodiment is obtained by rotating the pattern layout shown in FIG. 9 by 90 degrees.

However, in that arrangement as shown in FIG. 9, the size of each transistor increases, and additionally, the direction along which each wiring line extends is completely opposite to that of the present embodiment, and the layout shown in FIG. 9 does not have sufficient flexibility of arranging wiring lines and positioning contact balls, so that the relevant transistors cannot be embedded under the third metal decoder lines. As a result, the width of poly-decoder area 7 in the layout pattern shown in FIG. 9 is approximately 1.5 times as much as that of the layout shown in FIG. 6. In other words, the present embodiment employing low threshold voltage values Vth of most transistors has a smaller poly-decoder area 7, which is approximately ⅔ times that of the layout which does not employ such low threshold voltage values.

The comparison of the occupied area of the decoder circuit has been explained above. Below, the analysis of the operation speed of the circuit will be explained.

Figure 7:
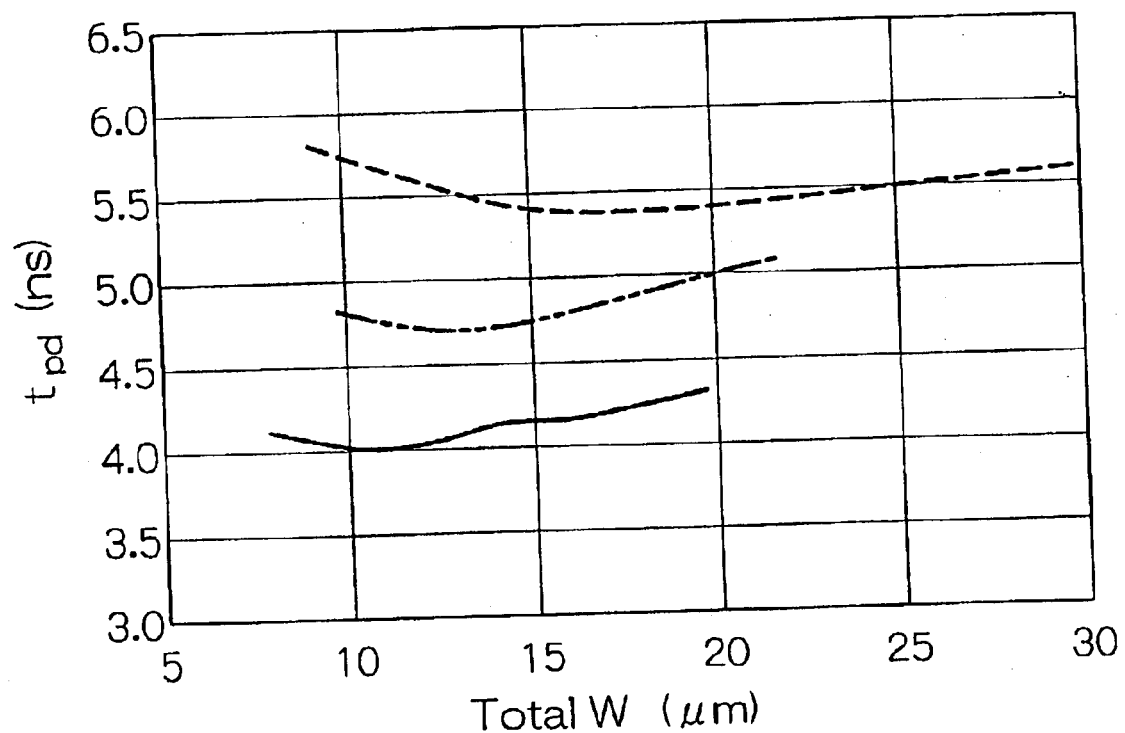
FIG. 7 is a graph showing simulated results of the relationship between the total value of gate widths of the transistors which form the circuit and the delay time with respect to the conventional and present logic circuits.

FIG. 7 is a graph showing simulated results of the relationship between the total value of gate widths of the transistors which form the circuit (called "Total W") and the delay time ($t_{pd}$) with respect to the conventional and present logic circuits. The horizontal axis of FIG. 7 indicates Total W (μm) while the vertical axis indicates the delay time (ns). In the graph, the broken line indicates the result related to the conventional NAND logic circuit, the alternate-long-and-two-short-dash line indicates the result related to the circuit which employs a circuit arrangement similar to the present embodiment (as shown in FIG. 1) but does not employ low threshold voltage values Vth, and the solid line indicates the AND logic circuit of the present embodiment which employs low threshold voltage values Vth. Here, "Total W" in FIG. 7 does not include the gate width of pMOS transistor $M_{14}$ of the inverter circuit.

In all cases, $t_{pd}$ generally shows a minimum value when Total W is in a specific range. However, the minimum value of $t_{pd}$ in the conventional NAND logic circuit is approximately 5.4 ns. In contrast, the minimum value of $t_{pd}$ in the logic circuit having a circuit arrangement according to the present embodiment can be reduced to approximately 4.7 ns, and furthermore, in the circuit employing low threshold voltage values Vth, the minimum value of $t_{pd}$ can be further reduced to approximately 4.0 ns.

As explained above, according to the present embodiment, the operation speed can be increased by employing an improved circuit arrangement, and additionally, the decoder area can be reduced by employing an improved pattern layout.

Figure 8A:
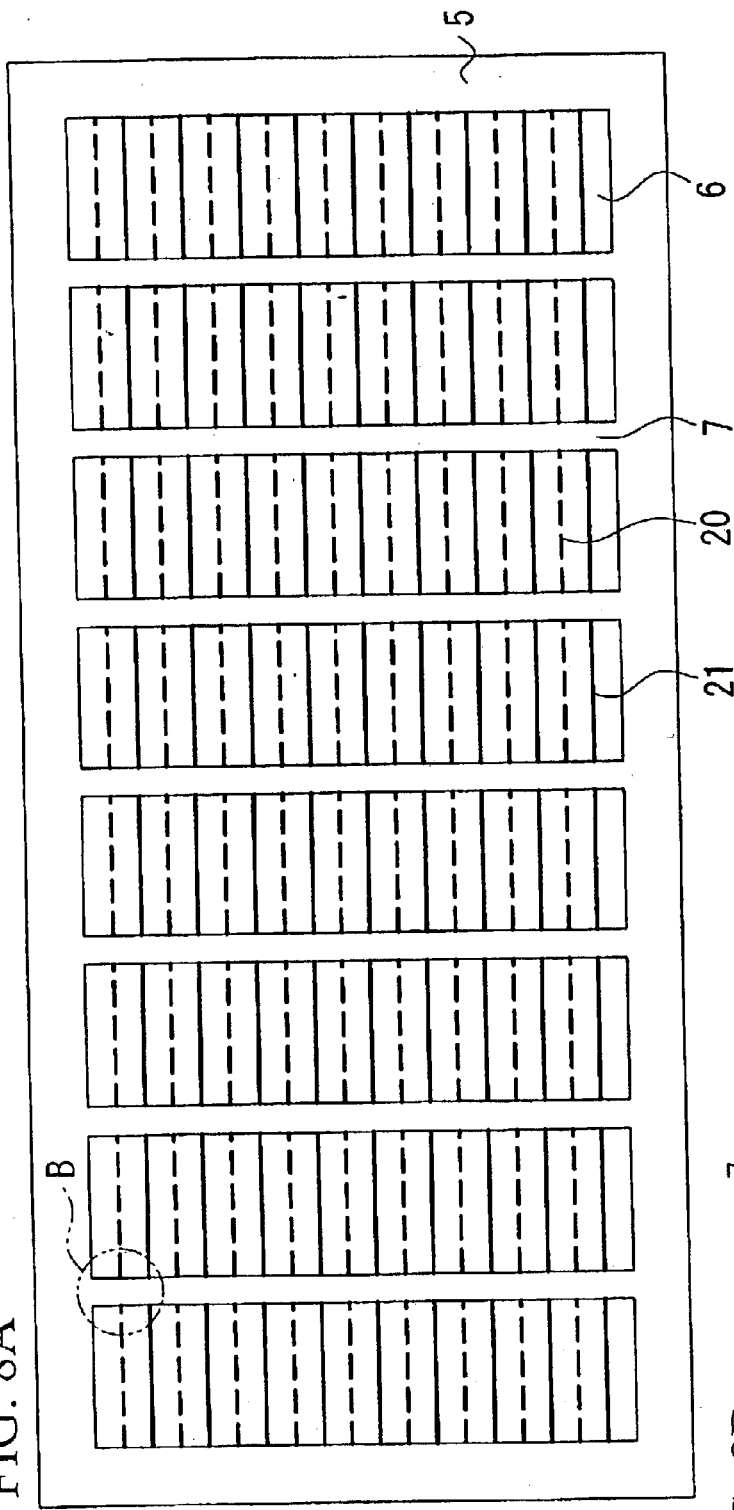
FIG. 8A is a diagram showing the general structure of the chip of a conventional semiconductor integrated circuit in which the pMOS transistors and the nMOS transistors are aligned in the transverse direction.
Figure 8B:
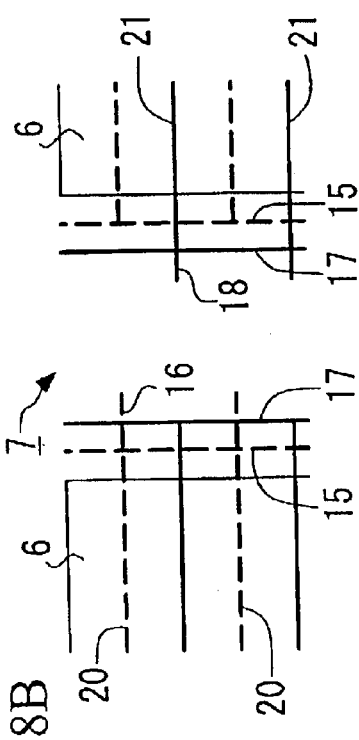
FIG. 8B is an enlarged view of a part surrounded by circle B in FIG. 8A.

As shown in FIGS. 8A and 8B (enlarged view of the area surrounded by circle B in FIG. 8A), in the conventional circuit arrangement in which pMOS transistors and nMOS transistors as constituents of the circuit face each other or are arranged or aligned in the transverse direction, even if power supply lines 20 crossing memory cell areas 6 are provided, in the poly-decoder area 7, power supply lines 16 in the transverse direction can extend to the area where pMOS transistors are provided, from a relevant power supply line 15 (at the left side in FIG. 8B) in the longitudinal direction, but cannot extend to the area where nMOS transistors are provided, from a relevant power supply line 15 (at the right side in FIG. 8B). Therefore, power supply lines 15 which face each other via the poly decoder area 7 cannot be connected. On the other hand, each earth line 18 can extend to the area where the nMOS transistors are provided, from a relevant earth line 17 in the longitudinal direction (at the right side in FIG. 8B), but cannot extend to the area where the pMOS transistors are provided, from a relevant earth line 17 (at the left side in FIG. 8B). Therefore, earth lines 17 which face each other via the poly decoder area 7 cannot be connected. Accordingly, each memory cell area 6 has independent wiring arrangements with respect to the power supply and earth lines, so that no wiring arrangement over a plurality of memory cell areas, that is, over the whole chip area, can be realized.

In contrast, in the present embodiment, as explained above, the power supply lines and earth lines are arranged and suitably connected over the whole chip area, and each of a set of the power supply lines and a set of the earth lines forms a wiring network. According to this structure, the power supply lines and earth lines can be much more efficiently and effectively arranged. In addition, the width of each line can be reduced.

Second Embodiment

Below, the second embodiment according to the present invention will be explained with reference to FIGS. 10A and 10B.

Figures 10A, 10B:
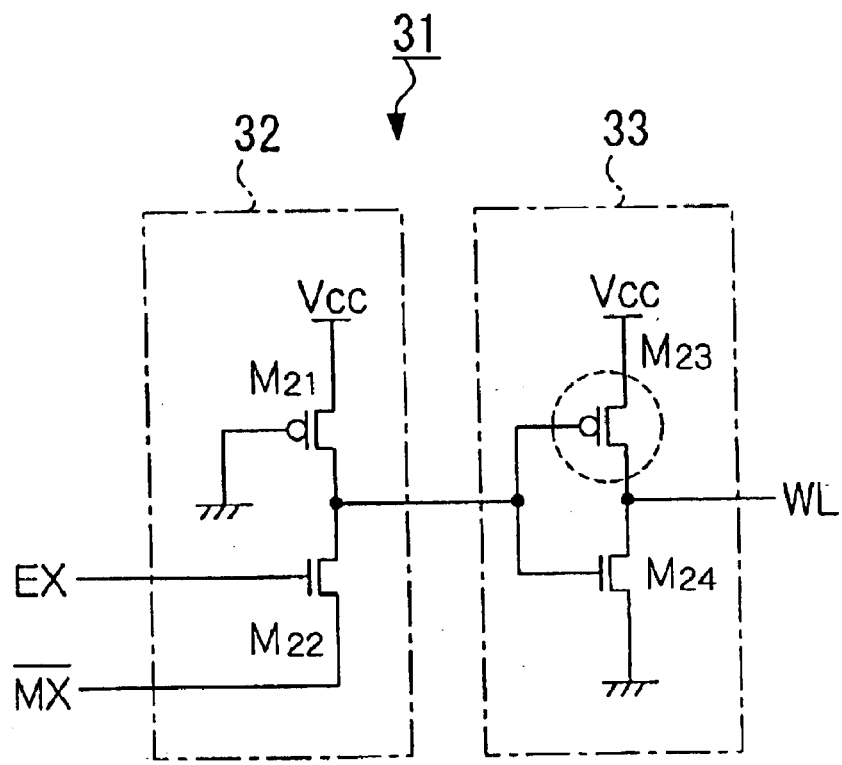
FIG. 10A is a circuit diagram showing an AND logic circuit employed in the semiconductor integrated circuit of the second embodiment according to the present invention.
FIG. 10B is a truth table of the logic circuit.

FIG. 10A is a circuit diagram showing a logic circuit employed in the semiconductor integrated circuit in the second embodiment. FIG. 10B is a truth table applied to the logic circuit. Similar to the first embodiment, the second embodiment also provides an AND logic circuit employing a combination of a NAND circuit having a CMOS structure, and an inverter circuit.

As shown in FIG. 10A, the AND logic circuit 31 of the present embodiment has a similar structure to the AND logic circuit 1 of the first embodiment, however, there is a difference in that in the NAND circuit 32, a single pMOS transistor $M_{21}$ is used and connected in place of the parallel-connected pMOS transistors in the first embodiment. Here, the gate electrode of the pMOS transistor $M_{21}$ is connected to an earth line, and the pMOS transistor $M_{21}$ is always in the ON state. Therefore, in contrast with the first embodiment, only input signals EX and $\nabla$MX are provided, and the input signal MX is unnecessary. Additionally, in the second embodiment, three transistors $M_{21}$, $M_{22}$, and $M_{24}$, that is, the transistors other than the pMOS transistor $M_{23}$ (in the inverter circuit 33), have lower threshold voltage values Vth than the threshold voltage value of the transistor $M_{23}$.

As shown in. FIG. 10B, in the logical operation, when the input signal EX is low (0), nMOS transistor $M_{22}$ is off regardless of the state of the input signal $\nabla$MX; thus, the level of the output from the NAND circuit (i.e., NAND output) is high (1) while the level of the output from the inverter (i.e., inverter output) is low (0). When the input signal EX is high (1), if the input signal $\nabla$MX is high (1), the NAND output is high (1) and the inverter output is low (0). On the other hand, when the input signal EX is high (1), if the input signal $\nabla$MX is low (0), the NAND output depends on the impedance ratio of pMOS transistor $M_{21}$ to pMOS transistor $M_{22}$. If the impedance ratio is low (in the design of the circuit), the inverter output is high (1).

According to the present embodiment, the number of necessary transistors can be further reduced by 1, and with the above-explained low threshold voltage values Vth, the operation speed can be increased and the circuit area can be reduced.

Third Embodiment

The third embodiment according to the present invention will be explained with reference to FIGS. 11A and 11B.

Figures 11A, 11B:
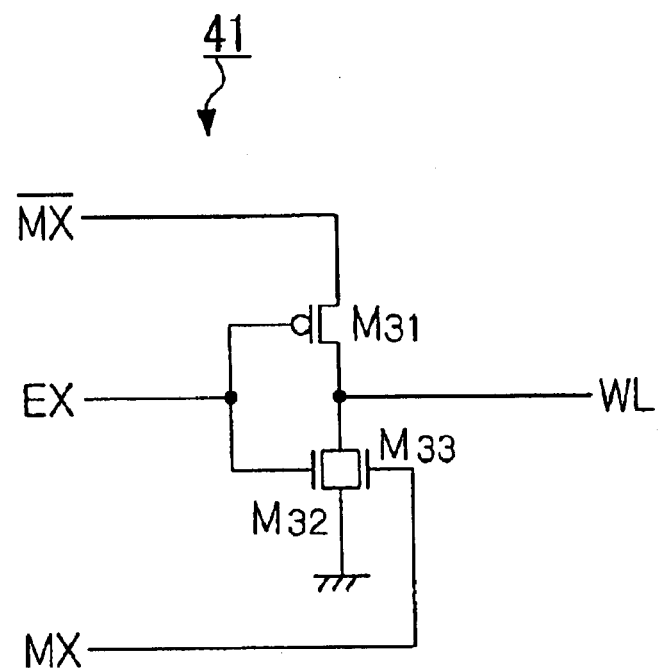
FIG. 11A is a circuit diagram showing a NOR logic circuit employed in the semiconductor integrated circuit of the third embodiment according to the present invention.
FIG. 11B is a truth table of the logic circuit.
Figure 13:
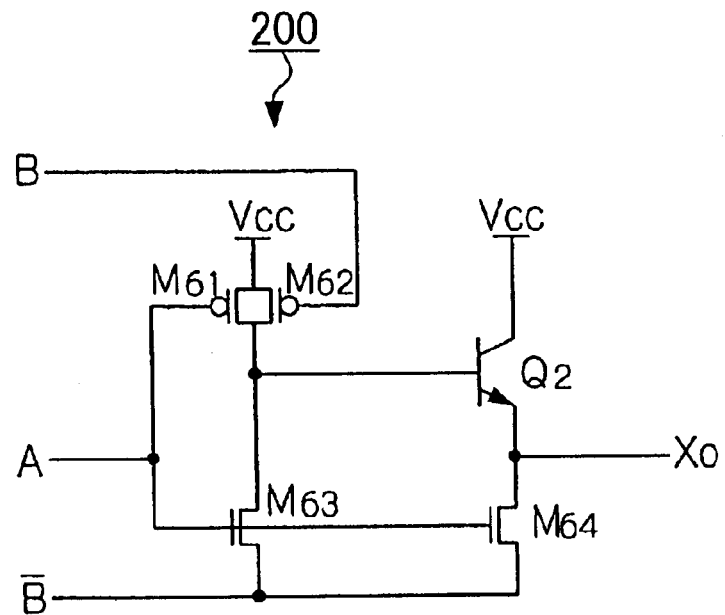
FIG. 13 is a circuit diagram showing an improved conventional logic circuit.
Figure 14:
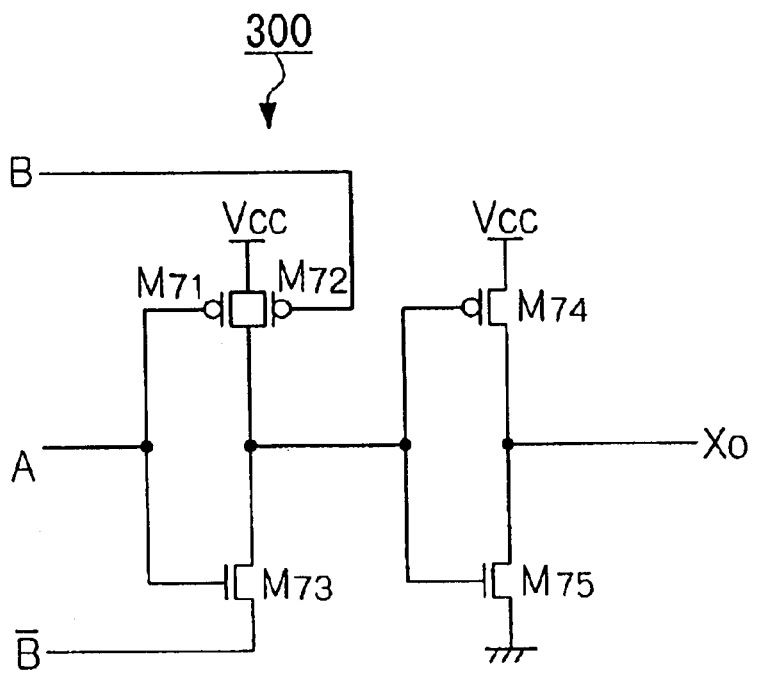
FIG. 14 is a circuit diagram showing another improved conventional logic circuit.

FIG. 11A is a circuit diagram showing a logic circuit used in the semiconductor integrated circuit in the present embodiment. Different from the first and second embodiments, the present logic circuit is a NOR logic circuit which does not include an inverter circuit.

As shown in FIG. 11A, the NOR logic circuit 41 in the present embodiment comprises a pMOS transistor $M_{31}$ in which input signal EX is input into the gate electrode and input signal $\nabla$MX is input into the source electrode, and parallel-connected nMOS transistors $M_{32}$ and $M_{33}$ in which input signals EX and MX are respectively input into the gate electrodes of these transistors and the source electrodes are connected to an earth line. The drain electrode of pMOS transistor $M_{31}$ and the common drain electrode of the nMOS transistors $M_{32}$ and $M_{33}$ are connected, and the connected point functions as an output WL of the NOR logic circuit. In the present embodiment, the threshold voltage values Vth of all of the three transistors $M_{31}$, $M_{32}$, and $M_{33}$ can be low, that is, no limitation of decreasing the threshold voltage value is applied to any of the used transistors.

As shown in FIG. 11B, in the logical operation, if at least one of the input signals EX and MX is high (1), one of the nMOS transistors $M_{32}$ and $M_{33}$ is on; thus, the output WL is low (0). Only when both of the input signals EX and MX are low (0), both of the nMOS transistors $M_{32}$ and $M_{33}$ are off. In this case, input signal $\nabla$MX is high; thus, pMOS transistor $M_{31}$ is on and the output WL is high (1).

The logic circuit 41 of the present embodiment operates based on the above-explained NOR logic, wherein a selected output (high (1)) is obtained only when both of the input signals EX and MX are low (0), and in the other cases, the output is low, which indicates a non-selected output.

The logic circuit 41 of the present embodiment comprises only three MOS transistors $M_{31}$, $M_{32}$, and $M_{33}$, and all of them can have low threshold voltage values Vth. Therefore, the area of the logic circuit can be most effectively reduced.

The technical range of the present invention is not limited to the above-explained embodiments, but any modification is possible within the scope and spirit of the claimed invention.

For example, in the first embodiment, the threshold voltage values Vth of the target transistors in the logic circuit are made low so as to reduce the gate widths of these transistors, and as a result, an improved transistor arrangement (rotated from the conventional circuit as shown in FIG. 9 by 90 degrees) can be realized, thereby reducing the chip area and allowing more efficient and preferable wiring of the power supply lines. However, a semiconductor integrated circuit to which any one of (i) the low Vth method and (ii) the longitudinal arrangement of the pMOS and nMOS transistors is applied can independently be an embodiment according to the present invention.

For example, the conditions necessary for realizing the above arrangement of being rotated by 90 degrees depend on the size of memory cells. That is, if it is assumed that the memory cells are very large, there is enough area in the longitudinal direction for arranging the logic circuits; thus, the reduction of the gate widths by applying low threshold voltage values Vth is unnecessary for rotating the (conventional) circuit by 90 degrees, and according to the rotation, effects such as efficient power supply lines can be obtained. However, with the current improvement in semiconductor devices, the size of memory cells is reduced as a matter of course. Therefore, preferably, as explained in the first embodiment, the threshold voltage values Vth are made low so as to reduce the size of each transistor used in the logic circuit, and the conventional circuit arrangement is rotated by 90 degrees in the pattern layout. Accordingly, a semiconductor integrated circuit having various effects can be realized, for example, the chip area can be reduced, the operation speed can be increased, the noise resistance or tolerance can be improved, and the like.

In addition, the specific voltage values Vth, pattern size, and the like in the above embodiments are just examples, and can be changed or modified.

What is claimed is:

1. A semiconductor integrated circuit having a logic circuit which comprises:
    one or more first transistors for supplying electric charges to an external load via an output terminal; and
    one or more second transistors for drawing electric charges from the load via the output terminal, and wherein:
        in all logical operations of the logic circuit, the above supply and drawing of electric charges are executed according to a combination of the states of a plurality of binary logic signals input from an external device; and
        among all the transistors in the logic circuit, each transistor other than the first transistors for supplying electric charges has a threshold voltage value lower than that of each first transistor.

2. A semiconductor integrated circuit as claimed in claim 1, wherein the logical circuit is applied to a decoder circuit.

* * * * *